(12) United States Patent
Schramm et al.

(10) Patent No.: US 8,532,828 B2
(45) Date of Patent: Sep. 10, 2013

(54) GEARBOX NOISE REDUCTION BY ELECTRICAL DRIVE CONTROL

(75) Inventors: Simon Schramm, Munich (DE);
Christof Sihler, Hallbergmoos (DE);
Jan Hemmelmann, Munich (DE);
Robert Roesner, Munich (DE)

(73) Assignee: General Electric Company, Schenectady, NY (US)

( * ) Notice: Subject to any disclaimer, the term of this patent is extended or adjusted under 35 U.S.C. 154(b) by 452 days.

(21) Appl. No.: 12/266,757

(22) Filed: Nov. 7, 2008

(65) Prior Publication Data

US 2009/0149999 A1    Jun. 11, 2009

(30) Foreign Application Priority Data

Dec. 11, 2007 (EP) .................................. 07122882

(51) Int. Cl.
| | |
|---|---|
| *G05B 21/00* | (2006.01) |
| *H03F 1/26* | (2006.01) |
| *H04B 15/00* | (2006.01) |
| *G10K 11/16* | (2006.01) |
| *G05D 19/02* | (2006.01) |
| *G01R 29/26* | (2006.01) |
| *G10K 11/178* | (2006.01) |
| *B62D 5/04* | (2006.01) |

(52) U.S. Cl.
CPC ............. *G05D 19/02* (2013.01); *G01R 29/26* (2013.01); *G10K 11/1788* (2013.01); *G10K 2210/1282* (2013.01); *B62D 5/0463* (2013.01)
USPC ......... 700/280; 702/191; 381/71.4; 381/71.1; 701/41

(58) Field of Classification Search
USPC .................... 700/280; 73/570–672; 702/56, 702/191–195
See application file for complete search history.

(56) References Cited

U.S. PATENT DOCUMENTS

| | | | | |
|---|---|---|---|---|
| 3,887,853 | A | * | 6/1975 | Klein et al. ................... 318/801 |
| 4,057,714 | A | * | 11/1977 | Fork et al. ........................ 702/34 |
| 4,384,246 | A | * | 5/1983 | Larsen et al. .................... 322/58 |
| 4,506,380 | A | * | 3/1985 | Matsui .......................... 381/71.9 |
| 4,567,975 | A | * | 2/1986 | Roll ......................... 192/84.961 |
| 4,695,736 | A | * | 9/1987 | Doman et al. ................... 290/44 |

(Continued)

FOREIGN PATENT DOCUMENTS

| | | |
|---|---|---|
| DE | 102005034678 | 10/2006 |
| EP | 0774411 A2 | 5/1997 |

(Continued)

OTHER PUBLICATIONS

Bindner, H., "Active Control: Wind Turbine Model", Jul. 1999, Riso National Laboratory, Roskilde, Denmark.*

(Continued)

*Primary Examiner* — Mohammad Ali
*Assistant Examiner* — Kelvin Booker
(74) *Attorney, Agent, or Firm* — Global Patent Operation; Douglas D. Zhang

(57) ABSTRACT

A system for damping audible noise from a drive train. One embodiment is a system with an audible noise signal from a drive train wherein a damping circuit produces a damping torque that is a phase shifted and amplified version of the noise signal that is applied to the air-gap torque of a generator or motor coupled to the drive train and effectively reduces the audible noise.

21 Claims, 7 Drawing Sheets

(56) References Cited

U.S. PATENT DOCUMENTS

| | | | |
|---|---|---|---|
| 4,982,825 A * | 1/1991 | Sekella | 192/90 |
| 5,049,797 A * | 9/1991 | Phillips | 700/258 |
| 5,112,019 A * | 5/1992 | Metzler et al. | 248/405 |
| 5,117,926 A * | 6/1992 | Worrall et al. | 175/56 |
| 5,126,641 A * | 6/1992 | Putman et al. | 318/128 |
| 5,172,717 A * | 12/1992 | Boyle et al. | 137/155 |
| 5,310,137 A * | 5/1994 | Yoerkie et al. | 244/17.27 |
| 5,313,407 A * | 5/1994 | Tiernan et al. | 700/280 |
| 5,398,904 A * | 3/1995 | Rees | 248/429 |
| 5,485,523 A * | 1/1996 | Tamamura et al. | 381/71.4 |
| 5,497,313 A * | 3/1996 | Bidaud et al. | 363/125 |
| 5,646,350 A * | 7/1997 | Robinson et al. | 73/602 |
| 5,677,958 A * | 10/1997 | Lehringer | 381/71.7 |
| 5,711,736 A * | 1/1998 | Kyodo | 475/149 |
| 5,802,184 A * | 9/1998 | Heath | 381/71.4 |
| 5,809,843 A * | 9/1998 | Barger et al. | 74/574.4 |
| 5,841,254 A * | 11/1998 | Balch et al. | 318/430 |
| 5,894,220 A * | 4/1999 | Wellstood et al. | 324/248 |
| 5,961,413 A * | 10/1999 | Martin | 475/83 |
| 6,028,402 A * | 2/2000 | Kumar et al. | 318/52 |
| 6,078,673 A * | 6/2000 | von Flotow et al. | 381/71.7 |
| 6,091,177 A * | 7/2000 | Carbonell et al. | 310/426 |
| 6,105,900 A * | 8/2000 | Welsh et al. | 244/1 N |
| 6,148,784 A * | 11/2000 | Masberg et al. | 123/192.1 |
| 6,163,121 A * | 12/2000 | Kumar et al. | 318/434 |
| 6,308,140 B1 * | 10/2001 | Dowling et al. | 702/60 |
| 6,348,751 B1 * | 2/2002 | Jermakian et al. | 310/207 |
| 6,405,701 B1 * | 6/2002 | Masberg et al. | 123/192.1 |
| 6,439,831 B1 * | 8/2002 | Conrad | 415/1 |
| 6,658,335 B2 * | 12/2003 | Kleinau | 701/41 |
| 6,751,534 B2 * | 6/2004 | Robichaux et al. | 701/22 |
| 6,832,973 B1 * | 12/2004 | Welsh | 700/280 |
| 6,865,466 B2 * | 3/2005 | Voight et al. | 701/53 |
| 7,013,859 B2 * | 3/2006 | Linnig | 310/103 |
| 7,106,867 B2 * | 9/2006 | Daly | 381/71.4 |
| 7,154,191 B2 * | 12/2006 | Jansen et al. | 290/55 |
| 7,154,193 B2 * | 12/2006 | Jansen et al. | 290/55 |
| 7,173,399 B2 * | 2/2007 | Sihler et al. | 322/40 |
| 7,180,204 B2 | 2/2007 | Grant et al. | |
| 7,285,926 B2 * | 10/2007 | McGarry et al. | 318/52 |
| 7,309,930 B2 * | 12/2007 | Suryanarayanan et al. | 290/55 |
| 7,370,720 B2 * | 5/2008 | Kokatsu et al. | 180/206.4 |
| 7,423,352 B2 * | 9/2008 | Suryanarayanan et al. | 290/55 |
| 7,423,411 B2 * | 9/2008 | Sihler | 322/19 |
| 7,450,725 B2 * | 11/2008 | Vaishya | 381/71.1 |
| 7,464,620 B2 * | 12/2008 | Li et al. | 74/425 |
| 7,542,575 B2 * | 6/2009 | DeLine et al. | 381/86 |
| 7,548,008 B2 * | 6/2009 | Jansen et al. | 310/266 |
| 7,640,808 B2 * | 1/2010 | Rehfeld et al. | 73/570 |
| 7,692,322 B2 * | 4/2010 | Wakasa et al. | 290/44 |
| 7,692,357 B2 * | 4/2010 | Qu et al. | 310/266 |
| 7,830,063 B2 * | 11/2010 | Jansen et al. | 310/266 |
| 7,839,048 B2 * | 11/2010 | Jansen et al. | 310/266 |
| 7,839,049 B2 * | 11/2010 | Jansen et al. | 310/266 |
| 7,853,026 B2 * | 12/2010 | DeLine et al. | 381/86 |
| 7,891,461 B2 * | 2/2011 | Miyoshi et al. | 180/443 |
| 7,992,662 B2 * | 8/2011 | King et al. | 180/65.22 |
| 8,194,873 B2 * | 6/2012 | Pan et al. | 381/71.11 |
| 2002/0198690 A1 | 12/2002 | Holzrichter et al. | 702/195 |
| 2003/0015359 A1 * | 1/2003 | Hanscombe | 180/65.6 |
| 2003/0030338 A1 * | 2/2003 | Beishline et al. | 310/75 R |
| 2003/0074120 A1 * | 4/2003 | Kleinau | 701/41 |
| 2003/0093231 A1 | 5/2003 | Kwon | |
| 2003/0112980 A1 * | 6/2003 | Vaishya | 381/71.1 |
| 2004/0176213 A1 * | 9/2004 | Benz et al. | 477/166 |
| 2004/0237683 A1 * | 12/2004 | Mikhail et al. | 74/410 |
| 2005/0077793 A1 * | 4/2005 | Garvey et al. | 310/90.5 |
| 2005/0077800 A1 * | 4/2005 | Hoeijmakers | 310/266 |
| 2006/0066110 A1 * | 3/2006 | Jansen et al. | 290/44 |
| 2006/0066111 A1 | 3/2006 | Suryanarayanan et al. | |
| 2006/0087270 A1 * | 4/2006 | Spicka et al. | 318/443 |
| 2006/0118309 A1 * | 6/2006 | Head | 166/358 |
| 2006/0197394 A1 * | 9/2006 | Applegate | 310/156.08 |
| 2006/0234829 A1 | 10/2006 | Berger et al. | |
| 2006/0244425 A1 | 11/2006 | Sihler | |
| 2007/0235247 A1 * | 10/2007 | Hirakawa et al. | 180/444 |
| 2008/0284575 A1 * | 11/2008 | Breed | 340/438 |
| 2009/0025488 A1 * | 1/2009 | Sihler et al. | 73/862.333 |
| 2009/0048747 A1 * | 2/2009 | Stridsberg | 701/55 |
| 2009/0079191 A1 * | 3/2009 | Mari et al. | 290/43 |
| 2009/0110554 A1 * | 4/2009 | Dukovic et al. | 416/41 |
| 2009/0232635 A1 * | 9/2009 | Menke | 415/17 |
| 2010/0113164 A1 * | 5/2010 | Rothe et al. | 464/73 |
| 2010/0187820 A1 * | 7/2010 | Wakasa et al. | 700/287 |
| 2011/0049902 A1 * | 3/2011 | Miekka et al. | 290/55 |
| 2011/0170701 A1 * | 7/2011 | Sakamoto et al. | 381/73.1 |
| 2012/0130580 A1 * | 5/2012 | Omote et al. | 701/22 |

FOREIGN PATENT DOCUMENTS

| | | |
|---|---|---|
| WO | WO 9830813 | 7/1998 |
| WO | WO 0208055 | 1/2002 |
| WO | WO2006/007891 A1 | 1/2006 |

OTHER PUBLICATIONS

Mulijadi, E. and Green, J., "Cogging Torque Reduction in a Permanent Magnet Wind Turbine Generator", Jan. 2002, 21$^{st}$ American Society of Mechanical Engineers Wind Energy Symposium, NREL: National Renewable Energy Laboratory.*

Hwang, S.; Eom, J.; Hwang, G.; Jeong, W.; and Jung, Y., "Cogging Torque and Acoustic Noise Reduction in Permanent Magnet Motors by Teeth Pairing", Sep. 2000, IEEE Transactions on Magnetics, vol. 36, No. 5.*

Singh, G.K., "A Research Survey of Induction Motor Operation with Non-Sinusoidal Supply Wave Forms", May 2005, Electric Power Systems Research, No. 75, p. 200-213.*

Vestas Wind Systems A/S, "General Specification V90-3.0 MW, 60Hz Variable Speed Turbine", Mar. 2004, Item No. 950010.R1, obtained online Aug. 15, 2011 at www.vestas.com.*

Hooft, E.L., "DOWEC Blade Pitch Control Algorithms for Blade Optimisation Purposes", Feb. 2001, Report No. ECN-CX-00-083, ECN Wind Energy.*

Buhl, T.; Thomsen, K.; Markou, H.; Mogensen, T.S.; Larsen, A.J.; Poulsen, N.K.; Politis, E.S.; Riziotis, V.; Engelen, T.G., "Design Guidelines for Integrated Aeroelastic Control of Wind Turbines-Task-12 Report", Dec. 2006, Risoe-R-1577, ISBN 87-550-3550-7.*

Vestas Wind Systems A/S, "General Specification V90-3.0 MW, 50Hz, OptiSpeed(TM) Wind Turbine", Jan. 2005, Item No. 950011. R7, obtained online Aug. 15, 2011 at www.vestas.com.*

Backx, P.W., "Prototype Testing of the Electric Variable Transmission", Apr. 2008, Technische Universitie and Eindhoven, Department of Mechanical Engineering, Dynamics and Control Technology Group.*

Curiac, S.S. and Singhal, S., "Magnetic Noise in Induction Motors", Jul. 2008, Proceedings of NCAD2008.*

Finley, W.R., "Noise in Induction Motors-Causes and Treatments", Nov. 1991, IEEE Transactions on Industry Applications, vol. 27, No. 6.*

Ait-Gougam, Y.; Ibtioven, R.; Touhami, O.; Louis, J.-P.; and Gabsi, M., "Inverse Modelling and Pulsating Torque Minimization of Salient Pole Non-Sinusoidal Sychronous Machines", Oct. 2006, Electric Power Systems Research, vol. 78, pp. 88-96.*

Hameer, S., "A Comparative Study of Application of Continuously Variable Transmission to a Single Main Rotor Heavy Lift Helicopter", Dec. 2009, Thesis Dissertation, Georgia Institute of Technology, School of Aerospace Engineering.*

Kobayashi, T.; Tajima, F.; Ito, M. and Shibukawa, S., "Effects of Slot Combination on Acoustic Noise for Induction Motors", Mar. 1997, IEEE Transactions on Magnetics, vol. 33, No. 2.*

Lenski, J.W.; and Valco, M., "Advanced Rotorcraft Transmission (ART) Program—Boeing Helicopters Status Report", Jun. 1991, 27$^{th}$ Joint Propulsion Conference.*

Bill, R.C., "Advance Rotor Transmission Program", May 1990, 46$^{th}$ Annual American Helicopter Society Forum.*

Lenski, J.W.; and Valco, M., "Advanced Rotorcraft Transmission (ART) Program Summary of Component Tests", Jul. 1992,, 28th Joint Propulsion Conference and Exhibit.*

Coy, J.J.; Handschuh, R.F.; Lewicki, D.G.; Huff, R.G.; and Karchmer, A.M., "Identification and Proposed Control of Helicopter Transmission Noise at the Source", Mar. 1987, NASA/Army Rotorcraft Technical Center, NASA Ames Research Center.*
Lewicki, D.G. and Coy, J.J., "Helicopter Transmission Testing at NASA Lewis Research Center", Jun. 1987, Testing of Aerospace Transmission Conference, NASA Technical Memorandum 89912, AVSCOM, Technical Report 87-C-10.*
Northern Power Systems, "The Gearbox Problem", Jul. 2009, Retrieved from the Internet on Nov. 7, 2012 at "www.northernpower.com".*
Petrovic, V.; Stankovic, A.M.; and Blasko, V., "Position Estimation in Salient P.M. Synchronous Motors Based on PWM Excitation Transcients", May 2003, IEEE Transactions on Industry Applications, vol. 39, No. 3.*
Tsivitse, P.J.; and Veihsmann, P.R., "Polyphase Induction Motor Noise", May 1971, IEEE Transactions on Industry and General Application, vol. IGA-7, No. 3.*
Vijayraghavan, P.; and Krishnan, R., "Noise in Electric Machines: A Review", Sep. 1999, IEEE Transactions on Industry Applications, vol. 35, No. 5.*
Barton, R.S., "Mod-1 Wind Turbine Generator Analysis", 1978, Retrieved from the Internet on Nov. 28, 2012 at "http://ntrs.nasa.gov/archive/nasa/casi.ntrs.nsas.gov/19780011688_1978011688.pdf".*
Belkhayat, D.; Roger, D.; and Brudny, J.F., "Active Reduction of Magnetic Noise in Asynchrounous Machine Controlled by Stator Current Harmonics", Sep. 1997, 1997 Eight International Conference on Electrical Machines and Drives.*
Boldea, I., "Variable Speed Generators, Chapter 10: Permanent Magnet Synchronous Generator Systems", 2006, CRC Press 20052005, ISBN: 978-0-8493-5715-2.*
Driesen, J.; and Belmans, R., "Electrical Motors/Generator Technology", 2005, Micro Gas Turbines, pp. 11/1-11/28, Educational Notes RTO-EN-AVT-131, Retrieved from the Internet on Nov. 28, 2012 at "www.rto.nato.int/abstracts.asp".*
Hsu, J.S.; Woodson, H.H.; and Weldon, W.F., "Possible Errors in Measurement of Air-Gap Torque Pulsations of Induction Motors", Jul./Aug. 1991, IEEE Power Engineering Society 1991 Summer Meeting, San Diego, CA.*

Munoz, D.M., "Acoustic Noise in Vector Controlled Induction Motor Drives", 2001, Lund University Department of Industrial Electrical Engineering and Automation.*
Krishnan, R., "Switched Reluctance Motor Drives—Modeling, Simulation, Analysis, Design and Applications", 2001, CRC Press, CRC Press LLC, ISBN: 0-8493-0838-0.*
Muljadi, E.; and Green, J., "Cogging Torque Reduction in a Permanent Magnet Wind Turbine Generator", Jan. 2002, $21^{st}$ American Society of Mechanical Engineers Wind Energy Symposium, Reno, Nevada.*
Hsu, John S and Sorenson, Patrick L. Field Assessment of Induction Motor Efficiency Through Air-Gap Torque. IEEE Transactions on Energy Convention, vol. 13, No. 3, Sep. 1996, pp. 489-494.
Leigh, Nigel. Vibration Analysis of the Windflow Turbine Gearbox. Commtest The Revolution; Commtest Instruments Ltd; 28b Moorhouse Avenue, Christchurch, New Zealand.
Li. Mingfeng; Lim, Teik C.;Shepard, W. Steve Jr.; and Guan, Y.H; Experimental Active Vibration Control of Gear Mesh Harmonics in a Power Recirculation Gearbox System Using a Piezoelectric Stack Actuator; Institute of Physics Publishing; Smart Mater, Struct. 14 (2005), pp. 917-927.
Cotrell, J. A Preliminary Evaluation of Multiple-Generator Drivetrain Configuration for Wind Turbines—Preprint; National Renewable Energy laboratory, Golden, Colorado; presented at the 21st American Society of mechanical Engineers (ASME) Wind Energy Symposium; Reno, Nevada, Jan. 14-17, 2003.
Dr. Krull, Ing. Frank-D; Vibrations and Dynamic Behavior of Gearboxes in Drive Trains of Windturbines from Session 2: Simulation of Components; Dewek 2004—Proceedings.
Rogers, Anthony L., Ph.D, et al.; Wind Turbine Acoustic Noise; Renewable Energy Research Laboratory, Department of mechanical and Industrial Engineering; University of Massachusetts at Amherst; Jun. 2002, Amended Jan. 2006.

* cited by examiner

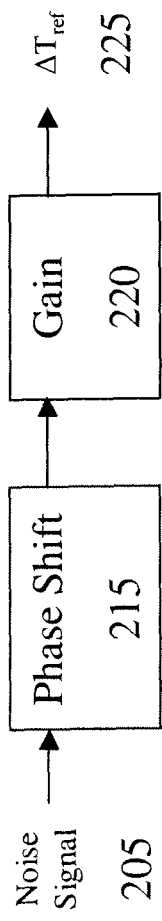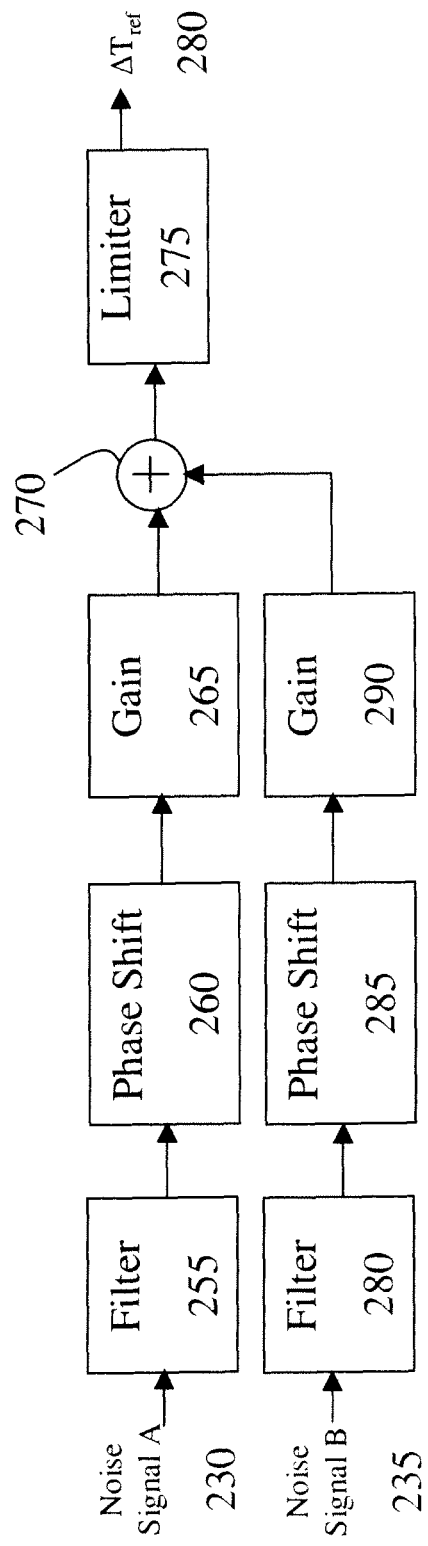
FIG. 2A
FIG. 2B

GEARBOX NOISE REDUCTION BY ELECTRICAL DRIVE CONTROL

FIELD OF THE INVENTION

The invention relates generally to noise reduction, and more particularly to the reduction of noise in electrical drives.

BACKGROUND OF THE INVENTION

There are numerous studies concerning the effects of low frequency noise on humans. While the results are somewhat subjective with respect to the effects of such noise, there is a growing tendency to reduce noise effects from industrial sources wherever possible to maintain goodwill with the end users and the public. The term low frequency as used herein refers to noise in the audible frequency range from about 20 Hz to several hundred Hertz. For reference purposes, the hearing range of most humans is typically about 20 Hz-20 KHz and termed the audible frequency range.

For reference purposes, the article prepared by the Renewable Energy Research Laboratory, Dept. of Mechanical and Industrial Engineering, University of Amherst (June 2002) entitled "*Wind Turbine Acoustic Noise*" describes the general noise and sound fundamentals. The complexity arises when various electrical, electromechanical and mechanical systems are operating in an integrated fashion, such as a wind turbine, where it is difficult to accurately pinpoint the exact source of any audible noise.

The sources of such industrial noise are numerous, however it is generally recognized that one such source of low frequency noise comes from the drive trains from electrical and electromechanical systems. As used herein, gearboxes or drive trains (also called transmissions) shall refer to systems that employ some form of assemblies that are used to transfer and/or convert torque and speed in conjunction with one or more shafts. Drive trains are commonly used in implementations in diverse fields that include aviation, maritime, transportation, industrial, and energy. For example, gearboxes are used for the rotors on helicopters, propeller shafts on ships, wind turbine shafts, vehicle transmissions, and various types of coupling involved with engines, motors and generators. The electrical drive trains typically transfer torque and examples include a motor that transfers torque to a load and a generator that uses a rotating shaft to generate electrical power.

Various forms of passive and active noise cancellation schemes have been used to lower or eliminate the low frequency noise with some limited success and often by complex designs. There is a perceived need for addressing the noise problems that has not been satisfactorily addressed.

SUMMARY OF THE INVENTION

One embodiment is a system for damping audible noise from a drive train, the system using a vibration or noise signal from the drive train, wherein an integrated damping circuit produces a damping torque signal. The damping torque is a phase shifted and amplified version of the noise signal. An electric machine is coupled to the drive train, wherein the damping torque signal is applied to an air-gap torque signal of the electric machine thereby reducing the audible noise.

The noise signal can be at least one of a constant value, an estimated value, and a measured value. In one example, the noise signal is measured by at least one sensor, wherein the sensor can be at least one of a microphone, accelerometer, strain gauge, and surface acoustic wave device.

In addition, the damping circuit can be selected from at least one of the group consisting of filter, phase shifter, amplifier, summer, and limiter. The phase shifter in one example is a time delay circuit. The damping torque in one embodiment has a phase shift with respect to the noise signal of approximately 90 degrees.

The drive train can be selected from at least one of the group consisting of a gearbox, hydrostatic transmission, hydrodynamic transmission, chain drive, belt drive, and Cardan coupling.

The system can include a converter coupled to the generator, wherein the converter combines the damping torque signal with the air-gap torque signal. Furthermore, a torque interface can be coupled between the damping circuit and the generator to condition the damping torque signal.

In one aspect, the damping torque is introduced to the generator proximate the high-speed shaft however the audible noise is substantially resulting from the low-speed shaft. Another feature includes having the audible noise damped in real time.

The damping torque does not have to be continuously applied, and can be intermittently applied to the air-gap torque signal. In one example, the damping signal has a modulation frequency that is approximately a frequency of the noise signal.

One embodiment is a method for damping audible noise from a drive train, comprising processing a noise signal from the drive train having a noise frequency, generating a corrective damping signal wherein the corrective damping signal has a phase shift and with a frequency approximately equal to the noise frequency, modulating a torque signal with the corrective damping signal to produce a modulated torque corrective signal, and applying the modulated torque corrective signal to an electrical machine coupled to the drive train thereby reducing the audible noise.

The phase shift can be approximately 90 degrees lagging, and can be in the range of 30 degrees to 150 degrees according to one example.

The processing, generating, modulating and applying can be intermittent. The method can further comprise repeating the steps of processing, generating, modulating and applying for at least one additional noise signal.

The method can also include at least one of filtering, amplifying and limiting the corrective damping signal. The drive train can include a gear assembly wherein the noise from the drive train includes a gear mesh noise.

One technical effect of the system is the reduction of audible noise of a drive train. One aspect includes a computer program product for reducing audible noise on a drive train including the features noted herein.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 2A is a basic block diagram illustrating a noise damping system configured in accordance with one embodiment.

FIG. 2B is a basic block diagram illustrating a noise damping system configured in accordance with one embodiment.

DETAILED DESCRIPTION

In general, certain embodiments of the invention provide for a reduction of noise issues with systems employing drive trains. An example of a drive train refers to those systems using gearboxes. As used herein, gearboxes shall include the various forms of transmissions and drive trains that experience noise and vibration issues.

According to one embodiment, the noise reduction is achieved by suppressing the effect of the noise excitation, such as the gear-mesh excitation, by using a noise reduction control circuit for the drive system. The noise reduction circuit generates a dynamic torque feedback signal with the same frequency as the noise signal but at a different phase, wherein the feedback signal is fed back to the air-gap torque of the system, such as electric motor or generator. As used herein, electric machine shall refer to the various motors and generators that can be coupled to a drive train.

Many electrical drives are operated at variable frequency, such as variable speed drives or wind turbine drive trains. At some speeds these systems can cause vibrations at the frequency of acoustic resonant points. These small vibration amplitudes in some limited cases can have an environmental impact if the resulting vibration frequency is in the human audible frequency range, especially if the noise levels required by engineering standards are exceeded or close to required standards. At certain speeds of the turbine, there is a drastic noise increase that is based on a complex interaction of the elements of the drive train involving the resonance effects.

Figure 1:
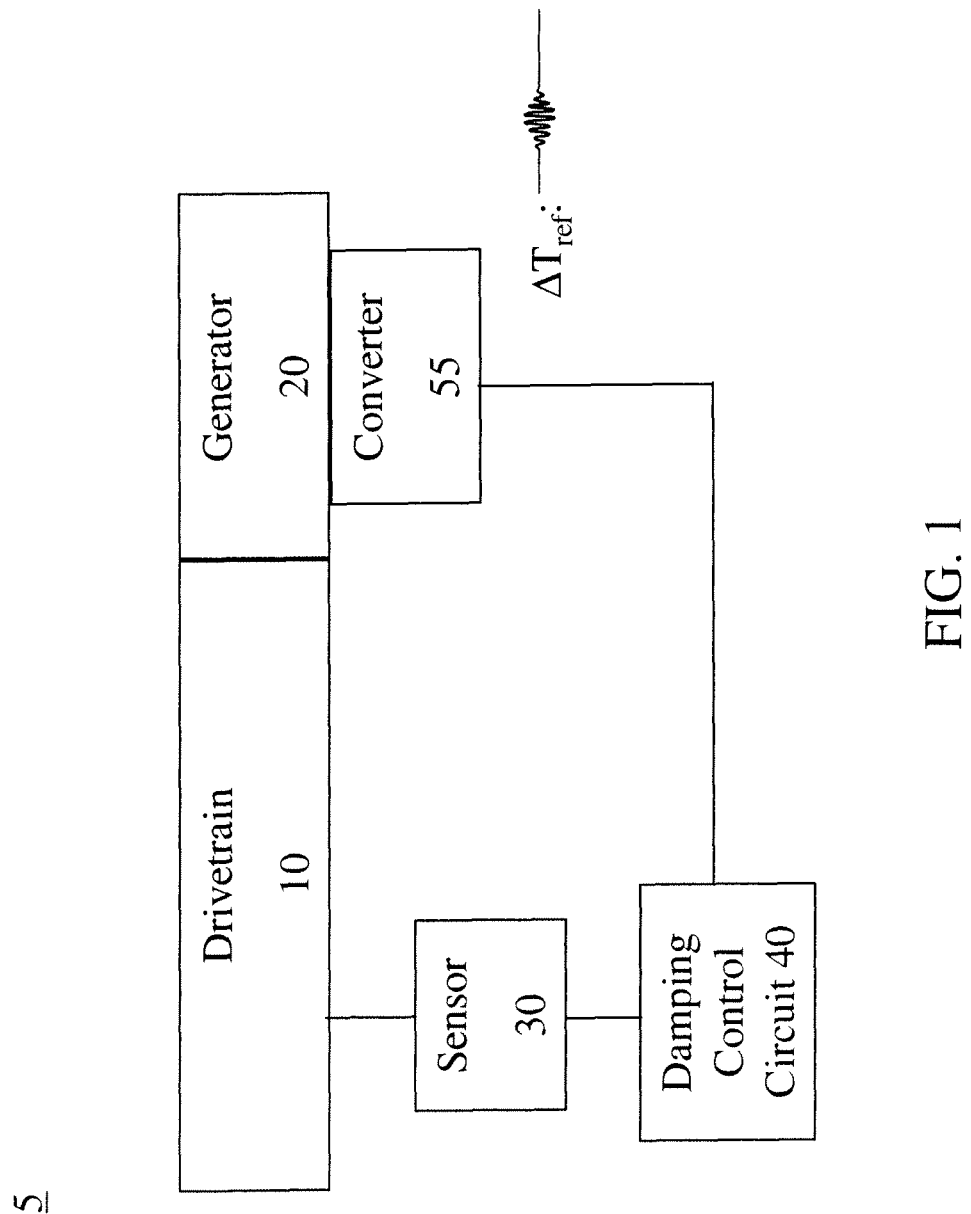
FIG. 1 is a basic block diagram illustrating a noise damping system configured in accordance with one embodiment.

Referring to FIG. 1, one general embodiment of a noise-reduced system 5 is depicted. The drive train 10 can be a gearbox with associated shafts and coupling as well as other forms of gear assemblies and transmissions that transfer torque. The drive train 10 is typically coupled to some form of device that accommodates the torque transfer such as a generator 20 in this example. While gear assemblies are used herein for illustrative purposes, there are other forms of transmissions (or torque converters) including hydrostatic transmissions, hydrodynamic transmissions, chain and belt drives, and Cardan couplings. In other embodiments, a motor (not shown) may be coupled to the drive train. One aspect includes a drive train that is a gearbox and generates noise excitation caused by the meshing gear.

Coupled to the drive train 10 is at least one sensor 30 that extracts the noise or vibration signals from the drive train 30. The sensor 30 can be acoustic, mechanical or electrical and includes microphones to process acoustical energy, accelerometers and other devices to extract vibration energy, and surface acoustic wave devices to extract electrical energy.

The sensor in one example can be defined by measurement categories such as force, acceleration, sensitivity, bandwidth, resolution, accuracy, linearity, directionality, environmentally dependency (e.g.: temperature and pressure), size, application, mounting. The output(s) from the sensors is communicated to a control section that interprets the measured sensor signal.

In one embodiment the vibration frequency can be predetermined tonal region or frequency that is known to be a concern for the system or it can be a measured frequency. In one embodiment the sensor obtains just a frequency measurement and in another embodiment the sensor obtains a noise level and the frequency measurement. One aspect includes a measurement of the frequency and noise level that is then used in a feedback circuit. The level or power of the noise level can be used to determine whether the system requires damping by comparing to a pre-determined limit, wherein the noise reduction would only occur when needed.

In a further embodiment the system operates with some measured frequency-response and a self-tuning phase lag. In this example the vibration frequency is obtained from the measurement and only the required phase lag for the damping torque needs to be processed.

According to one example, the sensor 30 is an acoustic sensor, and in one aspect the sensor is a microphone. A broadband microphone may not properly discern the low frequency signals properly and some filtering, such as a low-pass filter or bandpass filter can limit the received frequency range by the microphone. Amplification of the signal is also within the scope and knowledge of the present system. One example employing a microphone for measuring gearbox noise is described in the paper "*Vibration Analysis of the Windflow Turbine Gearbox*" by Commtest Instruments Ltd.

A further mechanism for measuring includes the use of accelerometers that measure structural vibration. Another sensor measurement embodiment is via a strain gauge that can sense deformation. In one embodiment, the sensing is accomplished using surface acoustical wave (SAW) devices, bulk acoustic wave (BAW) devices, and micro-mechanical systems (MEMS) devices.

Referring again to FIG. 1, the sensing section 30 is coupled to a damping control circuit 40. The damping circuit 40 is typically integrated into either the drive train electronics or the generator electronics, such as with the converter controller. The sensor 30 is typically proximate or coupled to the drive train 10, and can transmit the measured signals by wire or wireless techniques.

The information from the sensor 30 is communicated for processing by the control or damping circuit 40 that uses the measured noise signals to generate a phase shifted corrective signal to dampen the noise. The sensed signal from the sensor 30 can include noise frequency and noise power, frequency only or noise power only, depending upon design criteria. Furthermore, the sensing can be continuous, periodic, or based upon some manual or automatic event. In a general sense, the sensor measures the signal and the control section performs the subsequent processing.

The output of the damping circuit 40 is a dynamic torque signal ($\Delta T_{ref}$) that is typically coupled to the torque signal of the generator converter electronics 55. There are several ways to overlay the dynamic torque or noise damping signal within the control loop signals of the converter. According to one embodiment, the torque signal of the converter electronic is modulated by the dynamic torque signal, wherein the modulation frequency of the dynamic torque signal is approximately the same as the excitation source causing the noise amplification problems—but with a different phase. In one embodiment there is a torque interface used to condition the torque signal for subsequent introduction to the converter control circuit 55 and air-gap torque of the generator 20 or other electrical machine. In one example, a dynamic torque interface can process the signal from the damping circuit 40 resulting in a modulated corrective signal that is input to the converter 55 which can then be introduced to the generator 20.

The converter or converter controller 55 applies the corrective signal to the air-gap torque of the generator 40. In certain embodiments there is a torque signal, such as a DC signal level, that is modulated by the corrective signal wherein the modulation is at the frequency of the noise signal. The damping circuit 40, torque interface and/or converter 55 can be part of the existing converter controller section.

In a further aspect, the dynamic torque has the same frequency as the one that is responsible for the noise effect but with a different phase and is transmitted to the generator 20 to effectuate a damping of the noise. In one embodiment, the air-gap torque dampens gearbox noise using a signal modulated by the dynamic torque ($\Delta T_{ref}$).

Electrical generators typically utilize a rotating magnetic field created by the field winding carried by the generator rotor. As the rotor turns, a torque is produced on the rotor, acting through an air gap that exists between the rotor and the stator, that results from the electromagnetic field interaction with the stator winding. This torque which is also referred to as air gap torque, is proportional to the electrical power produced by the generator at constant rotor angular velocity. The magnetic field interacts with the stator armature winding to produce voltage and current which can then be supplied to a load. The use of the air gap torque and various air gap torque calculations in electrical machine processing is known to those skilled in the art.

According to one embodiment, the phase shifted noise-damping signal 50 in one embodiment is superimposed or otherwise combined with the air-gap torque of the generator 20. The introduction of the noise-damping signal to the electrical machine can be accomplished in several manners, some of which are described in U.S. Pat. No. 7,173,399 and Published Patent Application No. U.S. 2006/0244425.

There are several options for processing the dynamic torque signal for dampening the noise signal. One embodiment is illustrated in FIG. 2A, wherein the noise signal 205 is input to a phase shifter 215 that changes the phase of the noise signal. The noise signal 205 can be from the sensor of FIG. 1 and include at least one of a frequency and/or noise power level. The noise signal in one embodiment is a measured noise frequency and noise level and used in a feedback damping circuit to produce the torque signal.

In one aspect, satisfactory damping is achieved as long as the feedback signal is phase shifted by a delay of about T/4 for a phase shift of about 90 degrees lagging. The phase shift amount can be in a range of about 0<T<T/2, resulting into 0°<Phi<180° would be appropriate to apply damping behavior to the drive train. In certain aspects it may be desirable to have a safety margin. The corresponding effect of damping is proportional with sin(Phi), such that more torque is required to achieve the same results with pure adjusted phase shift compared to the more accurate phase shift.

According to one embodiment, the processing of the dynamic torque operates with some tolerance about the noise frequency. For example, if the noise signal was a 70 Hz component and varied by ±5 Hz, the feedback circuit would not be adversey affected. In more particular details by way of an illustrative example, a frequency variation of 5° results in a phase shift variation of 6.43° and a gain reduction to 0.99 (sin(83.57°), instead of 1.00 (sin(90°), if system is perfectly adjusted to 90° @ 70 Hz. This is far more robust than most active noise cancellation approaches that have high sensitivity to the noise frequency.

The phase shifting can be accomplished in a number of ways including phase shifting circuits and time delay modules.

In addition to analog techniques, the phase shift can be achieved by digital schemes including software configured hardware such as Field Programmable Gate Arrays (FPGA) or Digital Signal Processors (DSP), Programmable Logic Devices (PLD) and Complex Programmable Logic Devices (CPLD) which can include using memory elements such as look up tables.

In certain aspects, the robust nature of the feedback circuit permits a fixed or constant value for the phase shifter instead of a measured value. The fixed or constant value could be, for example, a predetermined value, a factory value, an intermittent measured value or some combination thereof.

Another manner of considering the phase shifting is in the time domain. For example, a 70 Hz noise signal has a period (T)=1/Frequency=1/70 Hz=14.29 ms. A time-delay module can be set to delay the phase of the 70 Hz signal by ¼ period (T)/4 representing a delay=3.57 ms (approx). This overall calculated time delay includes time delays caused by the converter control or by the drive train mechanical arrangement, wherein the time-delay module delays the remaining difference, e.g. $t_{delay}$=3.57 ms−($t_{converter}$−$t_{mechanical}$). The 3.57 ms delay is also acceptable for a 65 Hz or 75 Hz noise signal, or the band of 70 Hz±5 Hz. If the time delay of 3.57 ms cannot be achieved because of large time constants, such as converter time constant exceeds 3.57 ms, a time delay proportional to 90 degrees+360 degrees (or multiples of 360 degrees) which is equivalent to approximately 17.86 ms can be applied with similar damping behavior.

According to one aspect, the phase shifted signal is then amplified by a gain stage 220 such as an amplifier, to boost the dampening signal to a sufficient level to properly cancel the noise or reduce it to an acceptable level. The gain stage can be part of the feedback circuit using some measured or estimated noise level to provide some indication of the level for the damping signal. There may be one or more corrective iterations of the damping signal until a satisfactory level is achieved. This phase shifted corrective signal ($T_{ref}$) 225 is then used as an input to the torque interface and converter control system to dampen the noise signal. In one aspect, the gain level depends on the overall closed loop gain of the system including such features as the noise measurement, effective control loop gain, and mechanical "gain" of shaft.

In one aspect, the system uses a sensor to measure the level of the noise/vibration and can determine whether an acceptable level has been met. The sound pressure level or the strength of the noise signal can be measured and the damping only occurs if the noise is above a certain threshold. If the damping effect is not properly mitigated, further iterations and/or amplification of the damping signal can be performed.

Referring to FIG. 2B, another embodiment of the processing for the dampening signal is depicted. In this example, one or more noise signals 240, 235 can be processed to dampen more than a single low frequency noise or vibration signal. For example, the noise can be from two or more frequency signals and require corresponding dampening. There can be one or more sensors coupled to the drive train providing the one or more noise signals.

In the embodiment, the damping circuit comprises filtering of the sensed signal 230, 235 by one or more filters 255, 280 to focus on the vibration frequency of interest. For example, a bandpass filter can be used to isolate a frequency band within a region of the low frequency signal. Thus, the noise signal 230, 235 can be optionally filtered such as by a bandpass filter or low pass filter to reject interfering signals depending upon certain factors such as the desired signal of interest, the strength of the signals and the noise or interference.

The phase shift sections 260, 285 can then shift the one or more filtered noise signals to generate a phase shifted corrective noise signal. As noted satisfactory damping is achieved as long as the feedback signal is phase shifted by a delay of about 90 degrees lagging or T/4, however the phase shift can be in the range of about about $0<T<T/2$.

The phase shifted corrective noise signal can then be optionally amplified by one or more gain stages 265, 290. The resulting one or more phase shifted noise cancellation signals can be summed by a summer 270 and can be further processed by an optional limiter 275. The limiter 275 may be used for safety reasons to avoid a resulting signal that might harm personnel or equipment. The noise damping phase shifted signal ($T_{ref}$) 295 is then used as an input to the control system to address the noise signal.

Structure-borne noise from wind systems tends to be force related radiated noise from wind turbine vibration structures such as blades, tower and nacelle that can be excited by dynamic forces created by drive train power conversion components such as the generator and gearbox. According to one embodiment, the generator and power electronics are used to actively damp this tonality effect by generating a torque ripple at a noise frequency and with a different phase to counteract the potential noise issue. Rather than trying to continuously cancel gear mesh noise, one embodiment of the system works to effectively damp the noise when there is a certain noise level. The damping is accomplished by a torque signal acting on the shaft that is modulated at the same frequency as the excitation source causing the noise amplification with a different phase. For example, damp noise amplification caused by gear mesh excitation at various speeds. An aspect is to avoid resonance peaks by introducing the damping torque via the generator winding (high speed shaft), even though the noise itself may be caused at the low speed shaft. Wind turbines with full power conversion have an existing converter that can be used to apply the corrective torque signal and involve only minor retrofit. The low power damping signal corrects the noise issue without undue power consumption.

Figure 3:
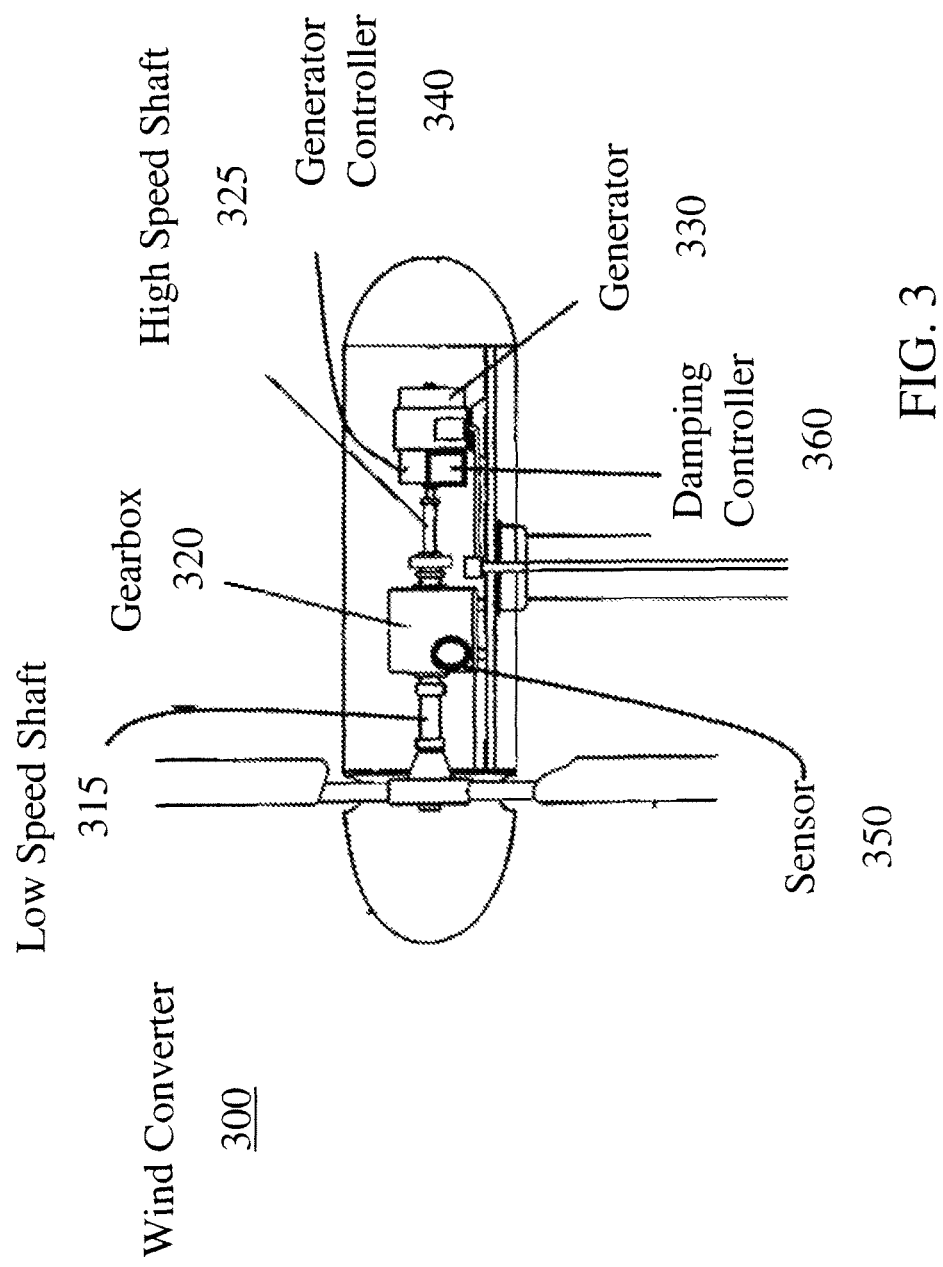
FIG. 3 is a basic block diagram illustrating a noise damping system configured in accordance with one embodiment.

Referring to FIG. 3, one aspect relates to a wind converter 300, wherein the noise reduction system suppresses noise effects generated by the drive train of the wind turbine. The wind converter 300 typically has a number of blades 310 that rotate due to the force of the wind. The rotating blades 310 cause the low speed shaft 315 to rotate at a relatively low speed but with great torque. A gearbox 320 is coupled to the low speed shaft 315 and transfers the rotational energy to a high-speed shaft 325. The drive train in this example includes the low speed shaft 315, the gearbox 320, and the high-speed shaft 325. The high-speed shaft 325 is coupled to a generator 330 that generates the power that can be conditioned and electrically coupled to some electrical grid (not shown).

One or more sensors 350 may be positioned about the drive train at locations where the audible noise may be problematic. Locations for sensing noise and vibration could be at the gearbox torque arms, the gearbox housing, the rotor shaft (low-speed shaft), the main bearing carrying the rotor shaft, the base frame of the nacelle, or the tower. Multiple sensor types and locations may be useful when different natural frequencies are present along the drive train elements such as the gearbox 320. For example, vibration or acoustic noise signals generated proximate the drive train, such as by the torque arms, can be sensed by the sensors 350 to detect the frequency and/or power of the noise signals.

In one embodiment the damping controller 360 generates an air-gap torque modulated signal that is applied to the controller 340 of the generator 330 thereby interacting with the high-speed shaft of the drive train in order to suppress torque components resulting at the low speed shaft of the drive train, which are excited by the gear meshing. Generators 330 are ideally suited to excite or dampen alternating torque components by means of converter control, and the corrective noise signal can be thus introduced into the generator electronics. The torque signal according to one embodiment is introduced to the generator electronics by adding the analog or digital correction signal to a given torque reference signal interface, wherein the torque signal is part of the normal current/speed control loop.

According to one embodiment, there is a separate converter controller 340 and damping controller 360, however in another embodiment the damping controller 360 is integrated with the existing generator controller 340 such that the sensor measurements are communicated to the integrated converter/damping controller.

According to one aspect the air-gap torque frequency corresponds to the noise frequency but having a different phase. In one embodiment the total phase shift corresponds to about T/4 in order to achieve an electronically adjustable damping of the torque components exciting the noise. The dynamic torque phase-shifted corrective signal can be superimposed to the air-gap torque signal of the generator.

Figure 4:
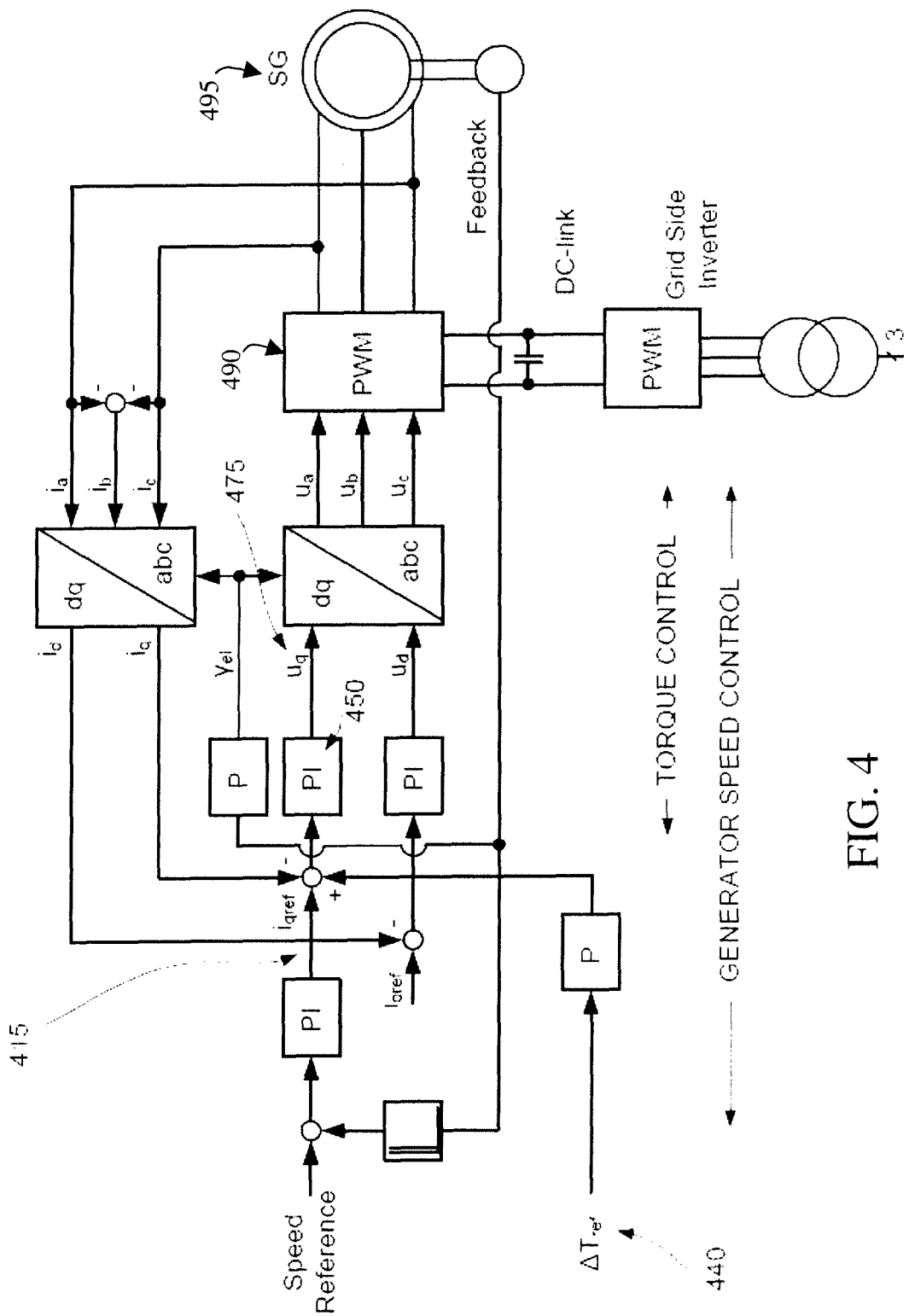
FIG. 4 is a basic block diagram illustrating a torque interface configured in accordance with one embodiment.

Referring to FIG. 4, one embodiment for introducing the damping signal to the generator is depicted. In more particular detail, the phase shifted modulated damping signal 440 $\Delta T_{ref}$ is an input to current controller 450. The current controller 450 has a current reference 415 used by the current controller 450 to establish the proper operating conditions of the system. According to one embodiment, the damping signal 440 is a modulated signal and is combined with the current reference 415. The current controller 450 controls the torque building current such that the modulated output signal 475 is an input to the modulator and converter 490 via a coordinate transformation. The converter applies the modified reference signal 475, which has the phase shifted noise damping signal component 440, to the generator.

Figure 5:
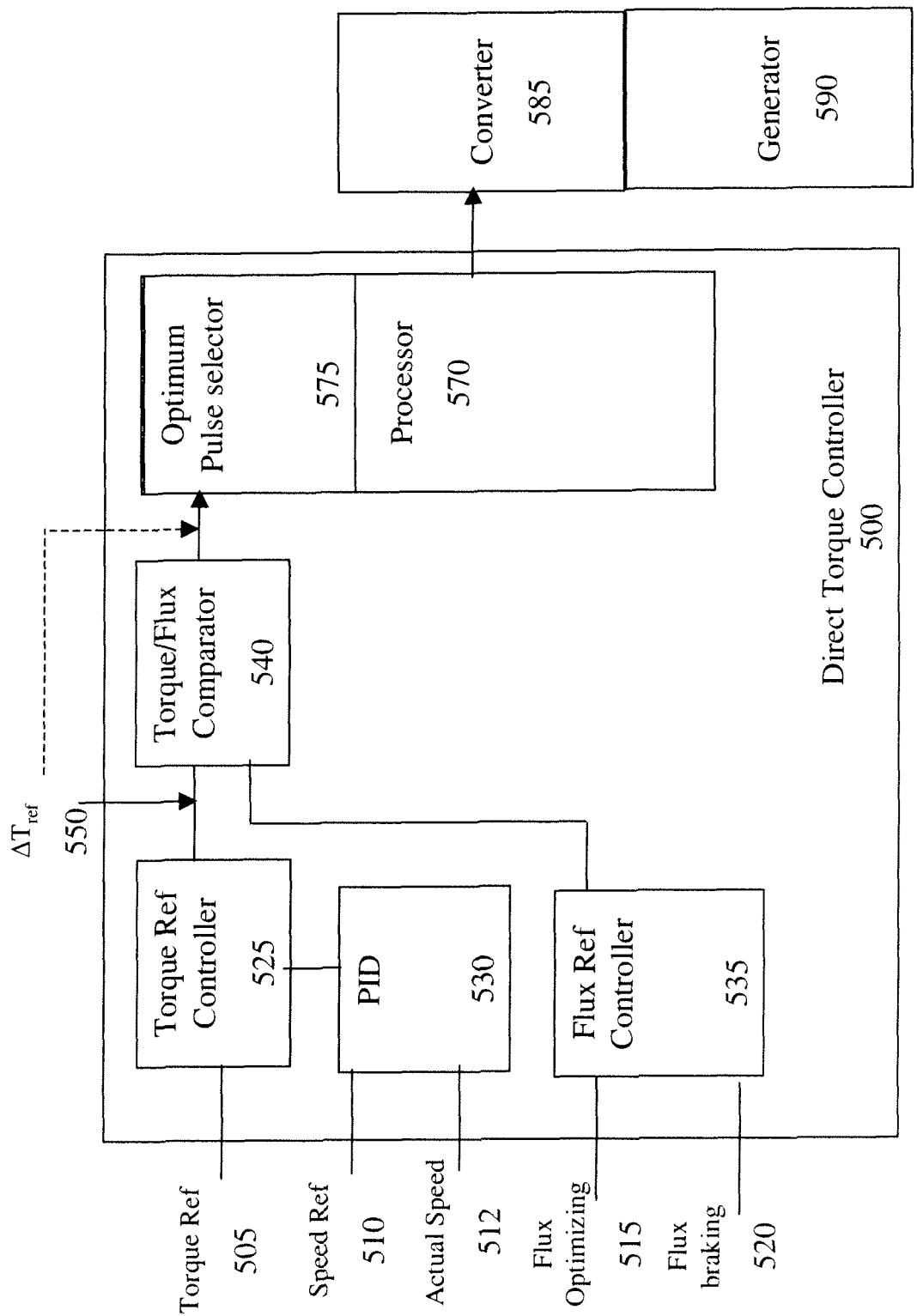
FIG. 5 is a block diagram illustrating an embodiment of a direct torque interface.

FIG. 5 is a further embodiment of a system for introducing the damping signal and reducing system noise is shown. In one embodiment the direct torque controller 500 is coupled to the converter 585 that is coupled to the generator 590.

There are a number of input signals such as a torque reference 505 that provides an indication of the torque of the generator. The torque reference 505 can be based on estimates or measurements. There is also a speed reference 510 with is an input to a proportional-integral-derivative controller (PID controller). The PID is used to correct errors between the speed reference 510 and the actual speed 512. The actual speed 512 can be taken from sensors and may also come from an adaptive model (not shown).

The torque reference 505 is an input to a torque reference controller 525. The torque reference controller 525 also uses the speed output from the PID to generate the torque command signal that is an input to the torque/flux comparator 540. The torque comparator compares an internal torque reference signal to an actual torque signal. There is also a flux comparator that compares the internal flux reference to an actual flux signal.

In one embodiment the torque signal from the torque reference controller 525 is modified with the modulated phase shifted noise-damping signal 550. In another embodiment, the damping signal 550 is added to the output of the torque/flux comparator 540.

The output from the torque/flux comparator can include a torque status, torque control signals, and flux status. The optimum pulse selector 575 of the processor 570 uses these signals to generate the optimal direct torque control signal that is then applied to the converter 585.

The output of the comparator 540 is an input to a processing unit that performs the processing functions. The processing unit is broadly defined as any computing device or processor able to perform some computing.

Figure 6:
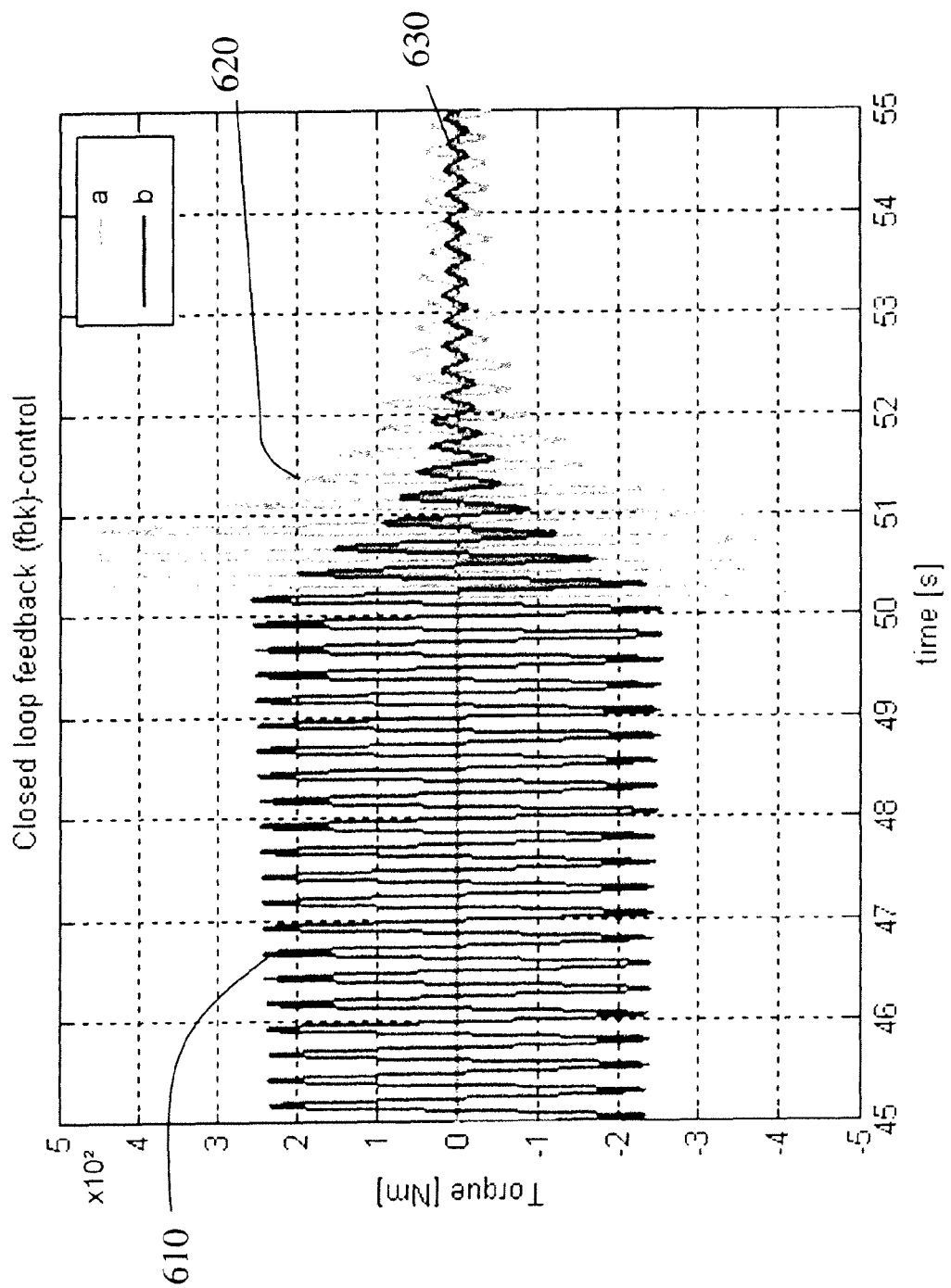
FIG. 6 is a plot showing a simulated noise signal and the response of the generator, indicated by the correction signal applied to the generator by power electronics, resulting into a well-damped noise signal.

Referring to FIG. 6, a simulated plot response of a generator is depicted with the designation of two curves a and b: a=generator damping torque component, b=oscillation torque component causing noise. In this plot, the torque or noise signal 610 excites the structure to radiate the audible noise. In this respect, torque and audible noise can be seen as related aspects. The torque associated with a drive train typically employs a counter-force to hold the system in balance, and for gearboxes, this counter-force is typically via the torque arm. The modulated damping signal 620 is applied to the air-gap torque and as shown, the resulting noise response 610 from the structure (or transmission) is greatly reduced.

According to one example, the noise signal can be a measurement from sensor technologies as detailed herein and may not necessarily be a torque measurement. The generator with the feedback signal can be understood as a torque correction signal that is an input to the generator electronics that is combined with the torque reference signal.

Figure 7:
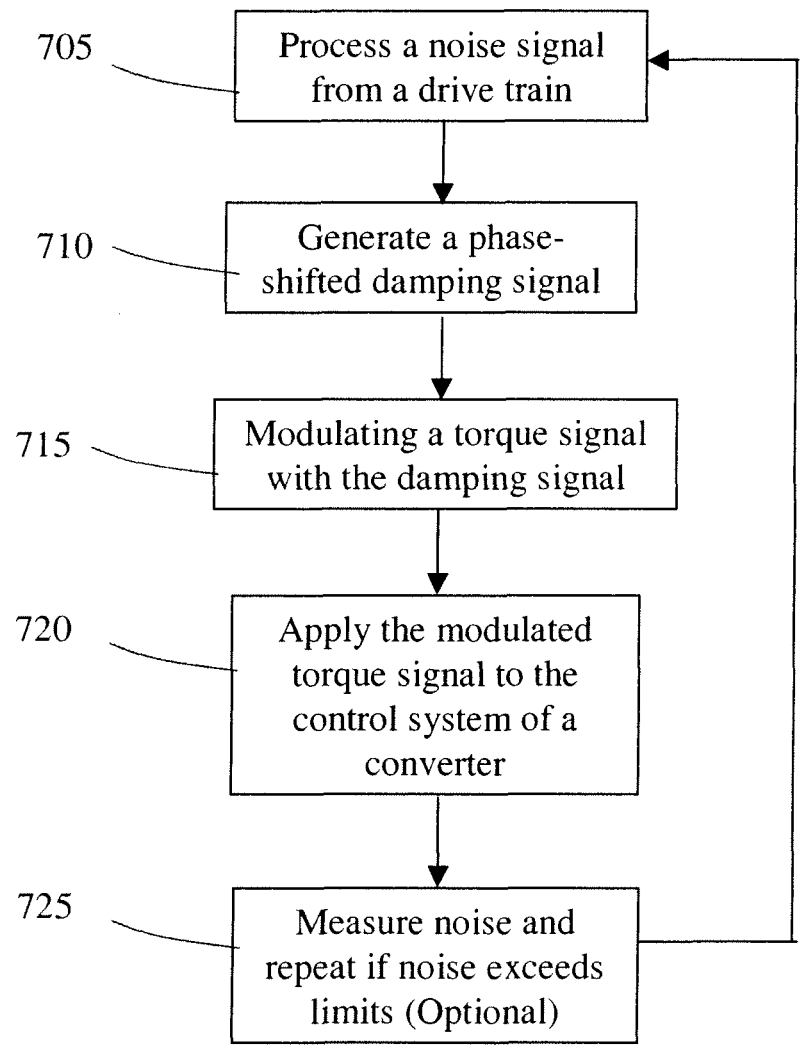
FIG. 7 is a flow chart illustrating the process flow for the noise damping system in accordance with one embodiment.

FIG. 7 is a flow chart illustrating one aspect of a damping system showing the closed loop of the damping circuit processed in real time. The process commences in one embodiment by processing a noise signal 705. The noise signal can be measured, intermittently measured or estimated. In one example the acoustic or vibration signal is measured by sensors, wherein the sensor measurements can be taken at the torque arms of the drive train.

The noise signal may be filtered and amplified to obtain an improved noise signal in certain implementations. The noise signal is then phase-shifted 710. One manner to shift the phase is by a time delay, and according to one embodiment the phase shifter shifts the time delay about T/4 or lagging 90 degrees. There are other examples such as a phase shift of about 90+360 degrees which is in connection with a helicopter drive that has a generator coupled to the drive train and with corresponding power electronics controlling the generator.

The phase-shifted damping signal is then modulated to create a modulated torque signal 715. The modulation can be a sine wave with the frequency of the sine wave approximately the frequency of the noise. The modulated torque signal is applied in one embodiment to the control system of a converter 720.

An optional step is to periodically (or upon some event) measure the noise signal and provide a corrective damping signal if the measured noise signal was above a certain threshold 725. The threshold would depend upon certain conditions with the overall result being to reduce the environmental noise to a safe level. Multiple iterations might be undertaken until a satisfactory damping was accomplished.

In one aspect the noise reduction system for the wind turbine gearbox is a low cost solution using standard sensing equipment and electronics. Such a system can be integrated as a feature of new products or as a retrofit for wind turbines with "noisy" gearboxes or in neighborhoods where the noise level must be kept as low as possible. The system can also be applied to other drive train applications with noise issues, especially when gearboxes are involved.

As detailed herein, one embodiment provides for applying the electronic silencer or noise reduction system without any apriori knowledge as to the cause of the noise signal. As the actual noise source is difficult to extract, it does not matter what is causing the elevated audible noise, such as a 70 Hz component. All that is required is some knowledge of the acoustic or vibration signal.

The noise signal in one aspect is measured such as employing a sensor at the torque arms. The noise signal may be processed to get a better defined noise frequency component. For example, the signal can be amplified and/or filtered prior to being phase shifted. The phase shifted noise frequency signal is then used to modulate the generator air-gap torque by means of the installed voltage-source converter. The voltage-source converter in one example and typically has a torque controller.

The current wind turbine systems are a practical and efficient renewable energy source. Improvements to the system have increased efficiencies and have led to increased demands. In addition, the location of the wind turbine sites is getting closer to residences through windfarms or from homeowner or company site installations. In order to maintain public support for the wind turbines, the wind industry addresses any noise issues that may arise and have adequate remedies.

The gearboxes in relation to wind turbines are relatively complex as the aerodynamic fluctuations cause large torque changes. As the wind turbines are increasing in size, the gearboxes are becoming larger and more complex. The larger gearboxes may be more prone to the mechanical noise generation issues. Such gearboxes include the multiple generator drive trains that can provide multiple power paths via multiple gear sets.

In the wind turbine example, the noise reduction system detailed herein allows a reduction of noise in the drive trains such as gearboxes. The noise reduction is achieved by increasing the damping behavior of the structure at a frequency related to the noise excitation, such as gear-mesh excitation, by means of the noise reduction circuit for the electrical drive system. The noise reduction circuit generates a dynamic torque which can be superimposed to the air-gap torque of the electric generator, wherein the dynamic torque has the same frequency as the noise signal (for example, in the range 40-70 Hz), but a different phase.

Another embodiment relates to implementing the present silencer system for helicopters. There have been many attempts to reduce the vibratory and acoustic loads on aircraft, particularly rotary wing aircraft such as helicopters, as the major noise source in helicopters is from the main rotor system. The main rotor system of a helicopter includes rotor blades mounted on a vertical shaft that project from the gearbox. The gearbox comprises a number of gears that reduce the rotational speed of the helicopter's engine to the much slower rotational speed of the main rotor blades. The noise reduction systems detailed herein can be implemented with the helicopter gearbox to shift the phase of the noise frequency such as using a phase shift of 90+360 degrees.

A benefit of the noise reduction system detailed herein is that it reduces the noise issues with minimal power consumption. Another feature is that it is implementable as a retrofit to existing systems such that only those systems requiring lower noise requirements would require a retrofit or factory installation.

While the noise issues related to drive trains can be complex, the present system is not restricted to a single noise source. Rather, one embodiment of the present system does not care about the sources of the noise and uses a measured acoustic or vibration signal to create a cancelling noise signal that is phase shifted, and applied to the air-gap torque of the generator. There can be multiple noise outputs from the drive train and one or more corrective damping signals.

It should be readily understood that the noise reduction system and methods herein are applicable to various electric machines including both motors and generators in a similar fashion and that the illustration in the figures pertaining to generators is intended for explanatory purposes.

One of the advantages of the noise reduction system herein is that it can co-exist and operate in conjunction with other active and passive noise reduction implementations. It seeks to reduce noise that already exists on the system. It can target a particular tonal frequency band that would otherwise exist.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A system for damping audible noise from a drive train, the system comprising:
    a sensor to detect an audible noise signal from the drive train, the audible noise signal including a vibration component at a frequency corresponding to an acoustic resonant frequency of a mechanical structure surrounding the drive train or a mechanical resonant frequency of the drive train and a noise level proportional to an amplitude of the audible noise signal;
    a damping circuit configured to produce a damping torque signal, wherein said damping torque signal is a phase shifted and amplified version of the audible noise signal from said drive train, the audible noise signal and damping torque signal having a same frequency;
    an electrical generator or an electrical motor coupled to said drive train; and
    a converter to apply the damping torque signal to an air-gap torque of said electrical generator or said electrical motor to reduce said audible noise only when the noise level is greater than a pre-determined threshold noise level.

2. The system of claim 1 wherein said noise signal is selected from at least one of a constant value, an estimated value, and a measured value.

3. The system of claim 1 wherein said noise signal is measured by at least one sensor.

4. The system of claim 3 wherein said sensor is at least one of microphone, accelerometer, strain gauge, and surface acoustic wave device.

5. The system of claim 1 wherein said damping circuit comprises elements selected from at least one of the group consisting of filter, phase shifter, amplifier, summer, and limiter.

6. The system of claim 5 wherein the phase shifter is a time delay circuit.

7. The system of claim 1 wherein the drive train is selected from at least one of the group consisting of gearbox, hydrostatic transmission, hydrodynamic transmission, chain drive, belt drive, and Cardan coupling.

8. The system of claim 1 comprising an electrical generator and a converter coupled to said electrical generator, wherein said converter applies said damping torque to said air-gap torque.

9. The system of claim 1, comprising an electrical generator, wherein said damping torque is introduced to said electrical generator proximate a high-speed shaft of the drive train and wherein said audible noise is substantially resulting from a low-speed shaft of the drive train.

10. The system of claim 1, wherein said damping torque is applied intermittently.

11. The system of claim 1 wherein said damping torque has a modulation frequency that is approximately a frequency of said noise signal.

12. The system of claim 1 further comprising a torque interface coupled between said damping circuit and said generator to condition the damping torque.

13. The system of claim 1 wherein said damping torque has a phase shift with respect to said noise signal of approximately 90 degrees.

14. The system of claim 1 wherein said audible noise is damped in real time.

15. A method for damping audible noise from a drive train, comprising;
    detecting an audible noise signal from said drive train, the audible noise signal including, a vibration component at a frequency corresponding to an acoustic resonant frequency of a mechanical structure surrounding the drive train or a mechanical resonant frequency of the drive train and a noise level proportional to an amplitude of the audible noise signal;
    generating a corrective damping signal, wherein said corrective damping signal has a phase shift and a frequency approximately equal to said audible noise frequency;
    modulating a torque signal with said corrective damping signal to produce a modulated torque corrective signal; and
    applying said modulated torque corrective signal to an air-gap torque of an electrical generator or an electrical motor coupled to said drive train to reduce said audible noise only when the noise level is greater than a pre-determined threshold noise level.

16. The method of claim 15 wherein said phase shift is one of approximately 90 degrees lagging and multiples of approximately 360 degrees and 90 degrees lagging.

17. The method of claim 15 wherein said phase shift is in the range of 30 degrees to 150 degrees.

18. The method of claim 15 wherein said detecting, generating, modulating and applying is intermittent.

19. The method of claim 15 further comprising repeating said steps of detecting, generating, modulating and applying for at least one additional noise signal.

20. The method of claim 15 further comprising at least one of filtering, amplifying and limiting said corrective damping signal.

21. The method of claim 15 wherein said drive train includes a gear assembly and said audible noise from said drive train includes a gear mesh noise.

* * * * *